United States Patent
Haruki

(10) Patent No.: US 7,647,574 B2
(45) Date of Patent: Jan. 12, 2010

(54) BASIC CELL DESIGN METHOD FOR REDUCING THE RESISTANCE OF CONNECTION WIRING BETWEEN LOGIC GATES

(75) Inventor: Tadashi Haruki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 424 days.

(21) Appl. No.: 11/589,186

(22) Filed: Oct. 30, 2006

(65) Prior Publication Data
US 2007/0150849 A1 Jun. 28, 2007

(30) Foreign Application Priority Data
Oct. 31, 2005 (JP) ............................. 2005-316188

(51) Int. Cl.
*G06F 17/50* (2006.01)
(52) U.S. Cl. .................... 716/10; 716/8; 716/9; 716/11
(58) Field of Classification Search ................ 716/8–14
See application file for complete search history.

(56) References Cited

U.S. PATENT DOCUMENTS

RE39,469 E * 1/2007 Fudanuki et al. .............. 326/39
7,245,019 B2 * 7/2007 Murata et al. ................. 257/774

FOREIGN PATENT DOCUMENTS

JP 2000-067094 3/2000

* cited by examiner

*Primary Examiner*—Vuthe Siek
(74) *Attorney, Agent, or Firm*—McGinn IP Law Group, PLLC

(57) ABSTRACT

The basic cell design method of the present invention is a method for carrying out: extended pattern formation for extending the patterns of input wiring and output wiring in the longitudinal direction, forming first extended patterns that extend with a prescribed dimensional width in a direction perpendicular to the longitudinal direction at the ends of the extended patterns, and forming second extended patterns that extend with the prescribed dimensional width from the input wiring and the output wiring at the center of the cell in the longitudinal direction; and dummy pattern formation for subsequently arranging dummy patterns in vacant areas within the cell.

20 Claims, 12 Drawing Sheets

Related Art

Related Art

BASIC CELL DESIGN METHOD FOR REDUCING THE RESISTANCE OF CONNECTION WIRING BETWEEN LOGIC GATES

This application is based upon and claims the benefit of priority from Japanese Patent Application No. 2005-316188 filed on 31 Oct. 2005, the content of which is incorporated by reference.

BACKGROUND OF THE INVENTION

1. Field of the Invention

The present invention relates to a basic cell design method that is used in the design stage of a semiconductor devices such as gate arrays and standard cells, a layout design method for designing the layout of a logic circuit in which basic cells are combined, a design device for executing these methods, and a program for causing a computer to execute these methods.

2. Description of the Related Art

In designing the layout of a logic circuit, a step of arranging logic gates in accordance with logic circuit information that includes information on the number of logic gates and the connection relations between these gates and a step of connecting the logic gates by wiring are carried out in succession. The logic gates that are included in a logic circuit may include a plurality of types. Methods of using circuit layout design devices for automatically determining the arrangement of logic gates have been disclosed (JP-A-2000-067094).

Explanation first regards one example of a layout design method in which the logic gates that are the basis of basic cells used in layout design are assumed to be inverters. FIG. 1 shows an example of the configuration of a basic cell.

A basic cell that is an inverter includes PMOS transistor 1 and NMOS transistor 2. Gate electrode 102 of PMOS transistor 1 and NMOS transistor 2 is connected to first-layer wiring 120 by way of contact hole 101. This first-layer wiring 120 is input wiring $T_{in}$.

The drain electrodes of PMOS transistor 1 and NMOS transistor 2 are connected to first-layer wiring 122 by way of contact holes 103. This first-layer wiring 122 is output wiring $T_{out}$.

Each of the source electrodes of PMOS transistor 1 and NMOS transistor 2 is connected to first-layer wiring 124 and 126 by way of contact holes 105 and 107, respectively. Although not shown in the figure, first-layer wiring 124 and 126 are each connected to the wiring of a second and subsequent layers by way of through-holes.

As shown in FIG. 1, the patterns that make up a basic cell are each arranged within cell area 150. The outermost periphery of each of the patterns is separated by a prescribed distance from the cell boundary of cell area 150 such that none of the patterns contacts the cell boundary. This configuration is adopted to prevent shorts between the outermost peripheries of patterns and the patterns of adjacent basic cells when a plurality of basic cells is arranged in proximity. Patterns are thus arranged within cell area 150 with a margin from the cell boundary.

Explanation next regards an example of a circuit when a plurality of inverters shown in FIG. 1 is connected. FIG. 2 shows an example of a circuit in which a plurality of inverters is connected. As shown in FIG. 2, inverters 141, 142, 143, and 144 are connected in a series. In addition, the output of inverter 143 is branched and connected to both the input of inverter 144 and the input of inverter 145.

A brief explanation is here presented regarding a design device for automatically arranging basic cells in accordance with the circuit shown in FIG. 2.

The design device is an information processor such as a CAD (Computer-Aided Design) tool. The design device includes: a memory unit for storing information such as the configuration of the above-described basic cell, the design tool, and layout rules; a control unit for carrying out operations for determining layout; an output unit for supplying the layout results as output; and a console unit by which a designer applies instructions as input. When the designer manipulates the console unit to enter logic circuit information and instructions indicating that layout is to be designed, the control unit reads information of the basic cell, design tool, and layout rules from the memory unit, arranges the basic cell in accordance with the logic circuit information, and supplies the layout results as output to the output unit.

Explanation next regards the layout results in which the above-described design device has been used to arrange basic cells in accordance with the circuit shown in FIG. 2. FIG. 3 shows an example of the layout when the basic cells as shown in FIG. 1 are used to realize the circuit shown in FIG. 2.

As shown in FIG. 3, basic cells of inverters 141-145 shown in FIG. 2 are arranged with cell boundaries in contact. First-layer wiring 128, which is the output wiring $T_{out}$ of inverter 141, is connected to first-layer wiring 129 of input wiring $T_{in}$ of inverter 142 by way of through-hole 110, second-layer wiring 130, and through-hole 111. The inter-cell connections of inverters 142, 143, 144, and 145 are similarly realized by second-layer wiring. Although the inter-cell connections are here realized by second-layer wiring, it is assumed that the inter-cell connections are realized by low-resistance wiring material of a second or subsequent layers and the connections are not necessarily limited to the second-layer wiring.

The layout rules here employed stipulate that inter-cell connections be realized by second-layer wiring and that cells be arranged such that the distance of the second-layer wiring that connects cells together be minimized.

However, the above-described layout method has several problems as described below.

The first problem is the high resistance of the connections between adjacent cells. This problem occurs because the connections between adjacent cells are realized by way of through-holes using the wiring material of second and subsequent layers, and the through-hole resistance, being greater than the wiring of second and subsequent layers, increases the resistance of inter-cell connections.

The second problem is the need for many wiring tracks of the second and subsequent layers and the consequent increase in chip size. This problem occurs because the wiring material of second and subsequent layers must be used in the connections between adjacent cells.

SUMMARY OF THE INVENTION

It is an object of the present invention to provide a basic cell design method, a layout design method, a design device, and a program for reducing the resistance of connection wiring between logic gates in a logic circuit that is made up from a plurality of logic gates.

A basic cell design method according to the present invention is a method of logic gates having input wiring and output wiring within a cell, wherein extended pattern formation is carried out for: extending the patterns of the input wiring and the output wiring in the longitudinal direction of the patterns, forming first extended patterns that extend in a direction perpendicular to the longitudinal direction with a prescribed dimensional width at the ends of the extended patterns; and forming second extended patterns that extend with the prescribed dimensional width from the input wiring and the output wiring at the center of the cell in the longitudinal direction, and after carrying out the extended pattern formation, dummy pattern formation is carried out for arranging dummy patterns in vacant areas within the cell.

A layout design method of the present invention is a layout design method of a logic circuit that uses basic cells according to the basic cell design method described above, wherein: a plurality of the basic cells are arranged in accordance with logic circuit information that includes the number of the logic gates and the connection relations of the logic gates; and the patterns of the input wiring and the output wiring between the plurality of basic cells are connected in the same layer as the patterns in accordance with the logic circuit information.

A design device according to the present invention comprises a memory unit for storing configuration information of logic gates having input wiring and output wiring within a cell, and a control unit for, upon the input of the configuration of the logic gates and instructions indicating that a basic cell of the logic gates is to be designed, extending the patterns of the input wiring and the output wiring in the longitudinal direction of the patterns, forming first extended patterns that extend in a direction perpendicular to the longitudinal direction with a prescribed dimensional width at the ends of the extended patterns, forming second extended patterns that extend with the prescribed dimensional width from the input wiring and the output wiring at the center of the cell in the longitudinal direction, and arranging dummy patterns in vacant areas within the cell.

A recording medium that can be read by a computer, of the present invention, is a recording medium that can be read by a computer in which is recorded a program for causing a computer to execute a design method of a basic cell that uses logic gates having input wiring and output wiring within a cell, the program causing a computer to execute processes for: carrying out extended pattern formation for, extending the patterns of the input wiring and the output wiring in the longitudinal direction of the patterns, forming first extended patterns that extend with a prescribed dimensional width in a direction perpendicular to the longitudinal direction at the ends of the extended patterns, and forming second extended patterns that extend with the prescribed dimensional width from the input wiring and the output wiring at the center of the cell in the longitudinal direction; and after carrying out the extended pattern formation, carrying out dummy pattern formation for arranging dummy patterns in vacant areas within the cell.

According to the present invention, first extended patterns are provided at the ends at which input wiring and output wiring extend in the longitudinal direction, whereby the areas in which connections are possible with cells that are adjacent in the longitudinal direction are broadened. In addition, second extended patterns of input wiring and output wiring are formed in the center of the cell, whereby the positions with respect to the longitudinal direction of the second extended patterns do not change despite 180° rotation of the cell. As a result, the connections between second extended patterns of cells that are adjacent in a direction that is perpendicular to the longitudinal direction are facilitated, and the degree of freedom of layout design is increased.

In the present invention, the patterns of input wiring and output wiring are formed as extended patterns that extend close to the cell boundaries, and as a result, in wiring connections with adjacent cells, the connection by wiring of the same layer as the input wiring and output wiring is facilitated. If input wiring and output wiring are formed by first-layer wiring, the wiring of second and subsequent layers need not be used for the wiring of inter-cell connections, and through-holes for connecting this wiring are thus not required. As a result, the present invention can suppress the increase in the resistance of inter-cell wiring that results from through-hole resistance. In addition, the provision of dummy patterns in vacant areas within cells prevents the provision of erroneous wiring in vacant areas.

The above and other objects, features and advantages of the present invention will become apparent from the following description with reference to the accompanying drawings which illustrate examples of the present invention.

DETAILED DESCRIPTION OF THE PREFERRED EMBODIMENTS

The basic cell design method of the present invention is characterized by the provision of extended patterns in which the input wiring pattern and output wiring pattern extend as far as the boundaries within cells, and by the provision of dummy patterns in vacant areas after formation of the extended patterns.

First Working Example

Explanation first regards the design device used in the design method of a basic cell and layout in the present working example.

Figure 4:
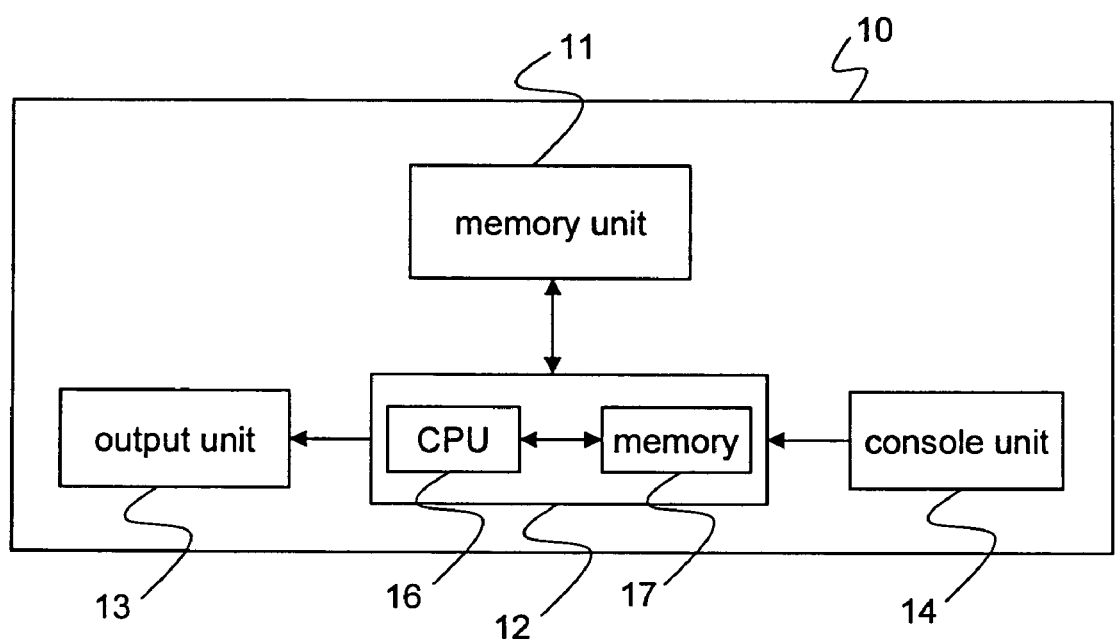
FIG. 4 is a block diagram showing an example of the configuration of a design device.

FIG. 4 is a block diagram showing an example of the configuration of the design device used in the present working example.

Design device 10 is an information processor such as a CAD tool, a personal computer, or a workstation. As shown in FIG. 4, design device 10 includes: memory unit 11 for storing logic circuit information and information such as design rules; control unit 12 for carrying out operations for the design of a basic cell and layout; output unit 13 for supplying the design results; and console unit 14 by which the designer enters instructions as input. Control unit 12 includes: CPU 16 for executing prescribed processes in accordance with programs; and memory 17 for storing programs. The design procedure of a basic cell is written in a program. The content of this design procedure of a basic cell will be explained later. Output unit 13 is a display device or a printer device.

In addition to logic circuit information including the configuration of logic gates that are the basis of a basic cell, information of the minimum lithographic dimension $L_{min}$ based on design rules is stored in memory unit 11. This minimum lithographic dimension is determined in advance by the necessary distance for maintaining electrical isolation between patterns and the dimension that can be patterned in fabrication.

When the designer manipulates console unit 14 to enter logic circuit information that includes the configuration of logic gates and to enter instructions directing the design of a basic cell and layout, control unit 12 reads the information of the configuration of logic gates and minimum lithographic dimension $L_{min}$ from memory unit 11 and carries out the design of a basic cell in accordance with a design procedure that will be described hereinbelow. Control unit 12 then arranges basic cells in accordance with the logic circuit information, and after establishing connections between basic cells by wiring, causes output of the layout results to output unit 13.

Explanation next regards the configuration of a basic cell of the present working example with reference to the accompanying figures.

Figure 5:
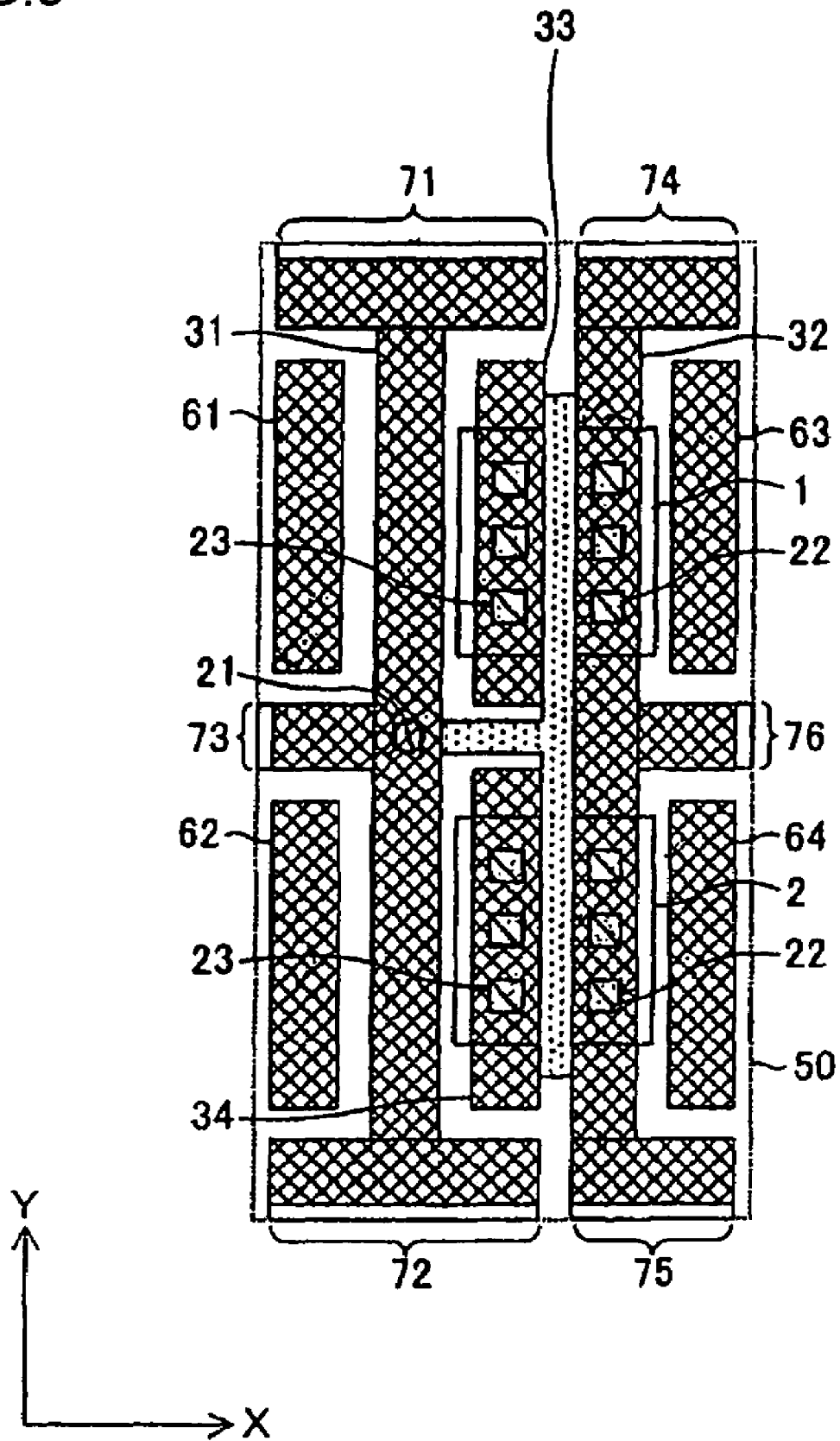
FIG. 5 shows the configuration of a basic cell in the first working example.

FIG. 5 shows the configuration of a basic cell in the present working example. As in the prior art, a basic cell is assumed to be an inverter. In addition, the X-axis is taken as the horizontal direction in FIG. 5, and the Y-axis is taken as the vertical direction.

A basic cell includes PMOS transistor 1 and NMOS transistor 2 as elements within cell area 50. The gate electrodes of PMOS transistor 1 and NMOS transistor 2 are connected to first-layer wiring 31 by way of contact hole 21. First-layer wiring 31 is input wiring $T_{in}$. In addition, the drain electrodes of these two elements are connected to first-layer wiring 32 by way of contact holes 22. First-layer wiring 32 is output wiring $T_{out}$.

Figure 1:
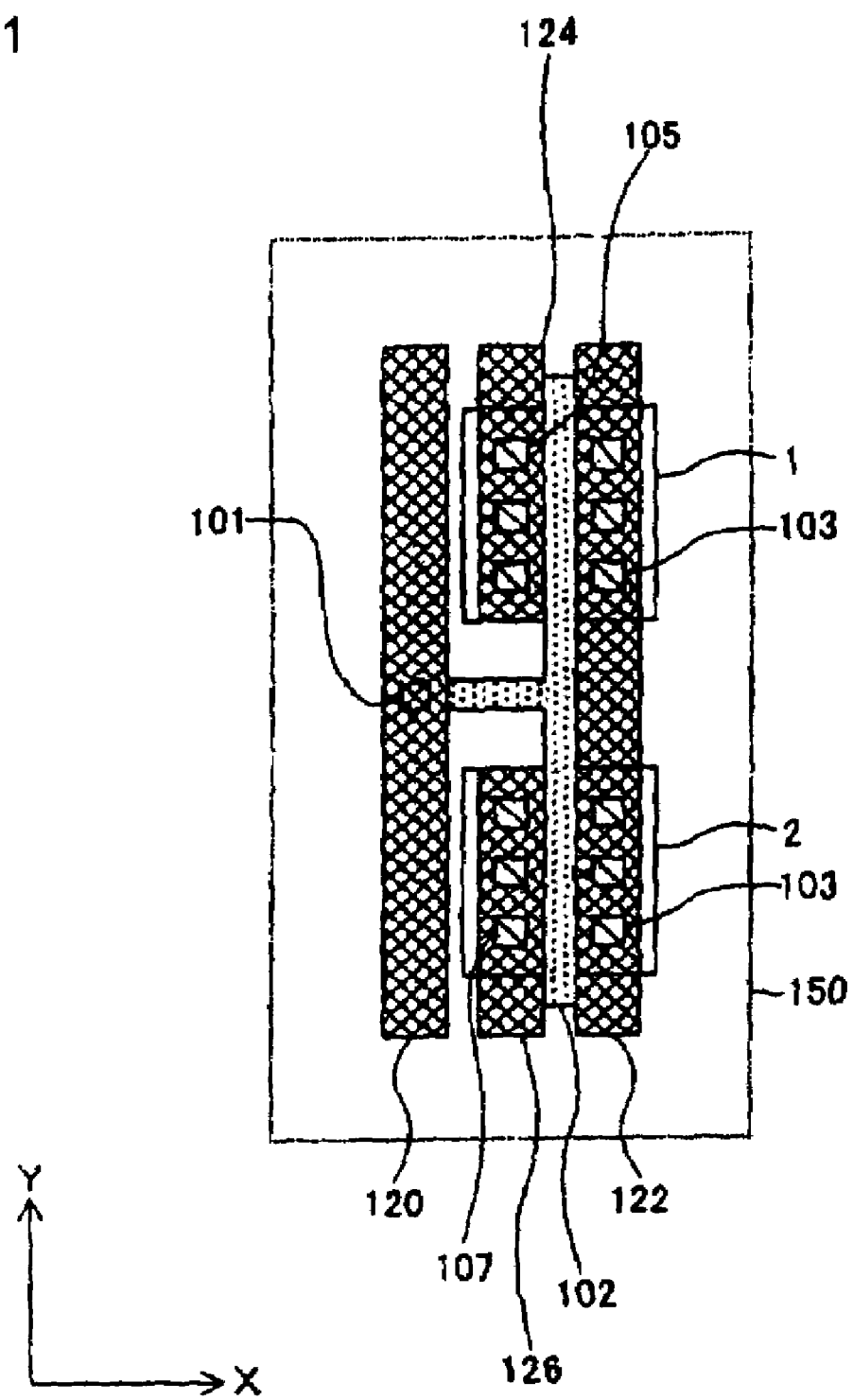
FIG. 1 shows one example of the configuration of a basic cell.

The basic cell of the present working example is a construction in which the patterns of input wiring $T_{in}$ and output wiring $T_{out}$ are extended in both the positive and negative directions of the Y-axis from the basic cell shown in FIG. 1 as far as positions separated by one-half the minimum lithographic dimension $L_{min}$ (hereinbelow represented as "(½) $L_{min}$") from the cell boundary.

In addition, to facilitate connection of patterns with other adjacent basic cells above and below a basic cell, extended patterns are formed that extend with the same dimensional width as input wiring $T_{in}$ in both the positive and negative directions of the X-axis from the ends of the pattern of input wiring $T_{in}$. Still further, an extended pattern is formed extending with the same dimensional width as output wiring $T_{out}$ in the positive direction of the X-axis from the end of the pattern of output wiring $T_{out}$. However, similar to the vicinities of the upper and lower cell boundaries, the end of the extended pattern that extends in the X-axis direction is set to a position separated by (½) $L_{min}$ from the cell boundary. In addition, the distance between extended patterns is prevented from falling below the minimum lithographic dimension in order that the patterns of input wiring $T_{in}$ and output wiring $T_{out}$ do not contact each other. The extended patterns that extend in the X-axis direction from the ends of the extended input wiring $T_{in}$ and output wiring $T_{out}$ are referred to as "first extended patterns."

An extended pattern having the same dimensional width as the input wiring $T_{in}$ at the center in the Y-axis direction of cell area 50 is formed as far as the position of (½) $L_{min}$ from the cell boundary in the negative direction of the X-axis. An extended pattern is then formed with the same dimensional width as output wiring $T_{out}$ at the center in the Y-axis direction of cell area 50 as far as the position of (½) $L_{min}$ from the cell boundary in the positive direction of the X-axis. These extended patterns provided in the center of cell area 50 are referred to as "second extended patterns."

As shown in FIG. 5, the first extended pattern of input wiring $T_{in}$ in the vicinity of the cell boundary on the upper side of cell area 50 is connection point 71, which is the point at which connection is possible with an adjacent basic cell. Similarly, the first extended pattern of output wiring $T_{out}$ in the vicinity of the cell boundary on the upper side of cell area 50 is connection point 74 with an adjacent basic cell. Further, the first extended pattern of input wiring $T_{in}$ in the vicinity of the cell boundary at the lower side of cell area 50 is connection point 72 with an adjacent basic cell, and the first extended pattern of output wiring $T_{out}$ is connection point 75 with an adjacent basic cell. The second extended pattern of input wiring $T_{in}$ in the vicinity of the cell boundary on the left center side of cell area 50 is connection point 73 with an adjacent basic cell, and the second extended pattern of output wiring $T_{out}$ is connection point 76 with an adjacent basic cell.

As described hereinabove, connection points 71 and 74 are of a configuration that extends as far as possible in the X-axis direction of cell area 50, apart from the spacing for maintaining isolation between patterns. As a result, the areas in which connection is possible with the patterns of adjacent basic cells are longer. This relation is also true for connection points 72 and 75.

In addition, because connection points 73 and 76 are positioned in the center in the Y-axis direction of cell area 50, the coordinates in the Y-axis direction of connection points 73 and 76 do not change even when the basic cell shown in FIG. 5 is rotated 180°.

As in the prior art, the source electrodes of PMOS transistor 1 and NMOS transistor 2 are each connected to first-layer wiring 33 and 34, respectively, by way of contact hole 23, and further, connected to the wiring of second and subsequent layers by way of through-holes not shown in the figure.

In addition, dummy patterns 61, 62, 63, and 64 are arranged as fill-in patterns for filling in vacant areas within cell area 50. This provision of dummy patterns in the vacant areas of cell area 50 can prevent the provision of other wiring in the vacant areas and can thus prevent the occurrence of unwanted parasitic capacitance. In the present working example, the dummy patterns are in a floating state, but these patterns may also be connected to the power supply wiring or GND wiring.

Figure 2:
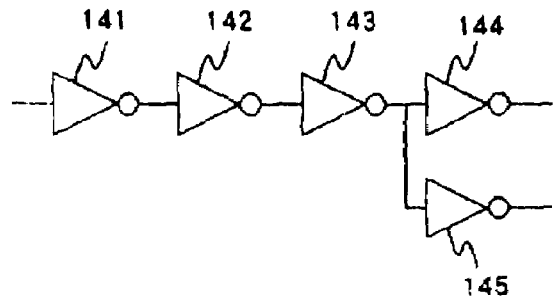
FIG. 2 shows an example of a circuit in which a plurality of inverters is connected.
Figure 3:
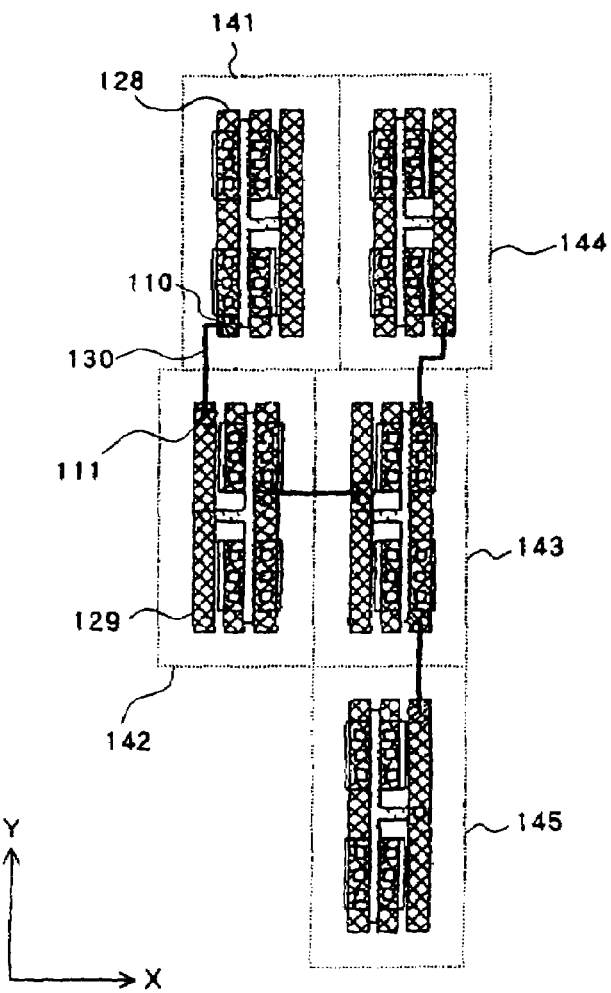
FIG. 3 shows an example of layout in which the basic cell shown in FIG. 1 is used to realize the circuit shown in FIG. 2.

Explanation next regards a case in which layout of the basic cells of the present working example is implemented according to the circuit of FIG. 2.

Figure 6:
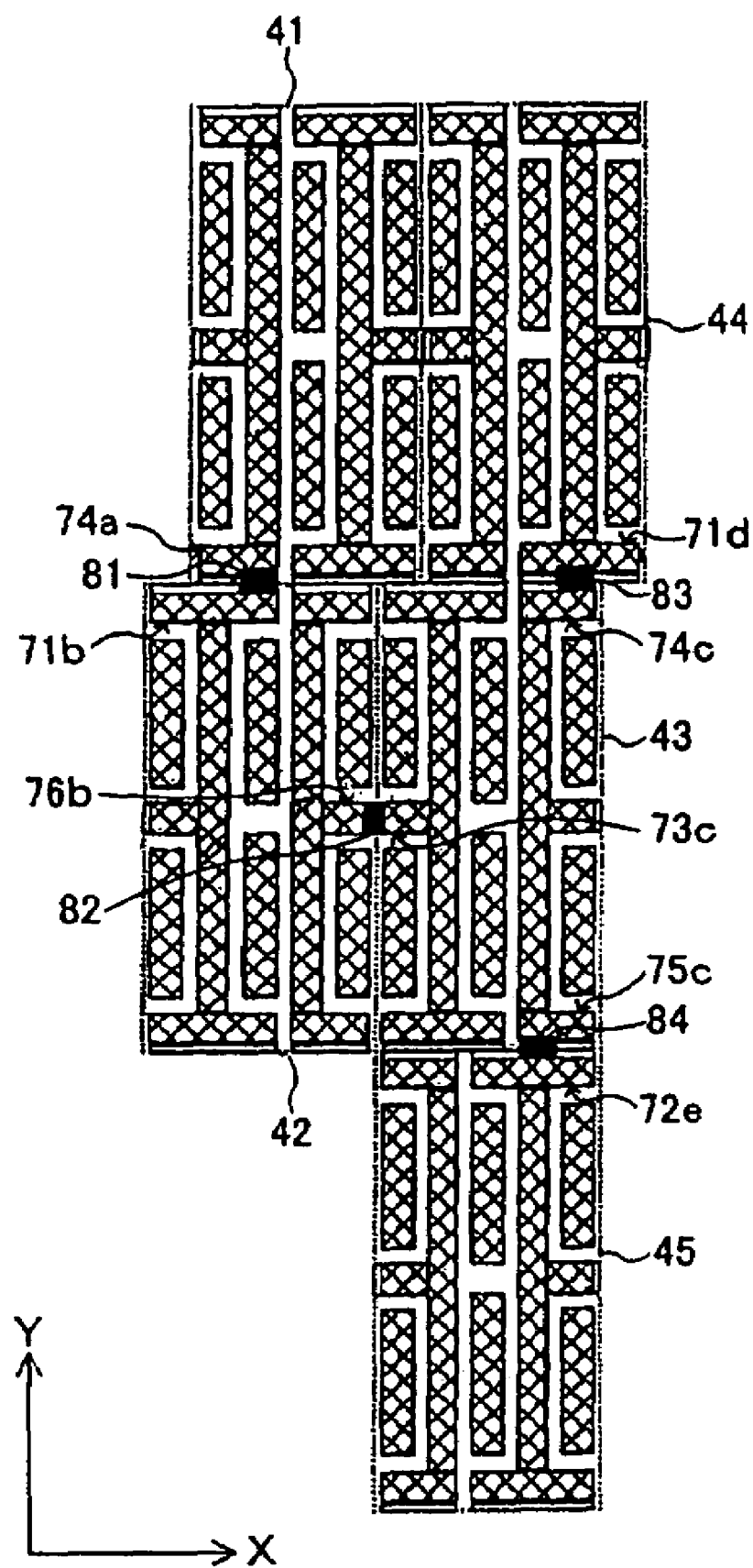
FIG. 6 shows layout when the basic cell shown in FIG. 5 is used to realize the circuit of FIG. 2.

FIG. 6 shows the layout for a case in which the basic cell shown in FIG. 5 is used to realize the circuit shown in FIG. 2. In FIG. 6, contact holes and the source electrodes, drain electrodes, and gate electrodes of transistors have been omitted from the figure.

Inverters 141, 142, 143, 144, and 145 of the circuit shown in FIG. 2 correspond to inverters 41, 42, 43, 44, and 45, respectively, shown in FIG. 6. Inverters 41, 43, and 45 shown in FIG. 6 are in a state in which the basic cells shown in FIG. 5 are rotated 180°.

As shown in FIG. 6, connection point 74a of inverter 41 confronts connection point 71b of inverter 42 at the cell boundary. Inter-cell connection can be realized by using first-layer wiring material between these connection points. In this way, output wiring $T_{out}$ of inverter 41 and input wiring $T_{in}$ of inverter 42 are connected by inter-cell first-layer wiring 81.

Connection point 76b of inverter 42 confronts connection point 73c of inverter 43 at the cell boundary, and connection of these connection points realizes connection between output wiring $T_{out}$ of inverter 42 and input wiring $T_{in}$ of inverter 43 at inter-cell first-layer wiring 82. Connection point 74c of inverter 43 similarly confronts connection point 71d of inverter 44 at the cell boundary, and output wiring $T_{out}$ of inverter 43 is connected to input wiring $T_{in}$ of inverter 44 by inter-cell first-layer wiring 83. Connection point 75c of inverter 43 confronts connection point 72e of inverter 45 at the cell boundary, and output wiring $T_{out}$ of inverter 43 is connected to input wiring $T_{in}$ of inverter 45 by inter-cell first-layer wiring 84.

The patterns of the input wiring and output wiring of inverters are extended as far as the cell boundaries, and the wiring connections with adjacent cells can therefore be realized by the minimum distance. In addition, in patterns that do not connect with adjacent cells, the distance of the minimum lithographic dimension $L_{min}$ is maintained with respect to the closest patterns. This is because the outermost peripheries of patterns of basic cells maintain a distance of at least (½) $L_{min}$ from cell boundaries.

Explanation next regards the design method of the basic cell shown in FIG. 5 and the layout shown in FIG. 6 by means of the design device shown in FIG. 4.

Figure 7:
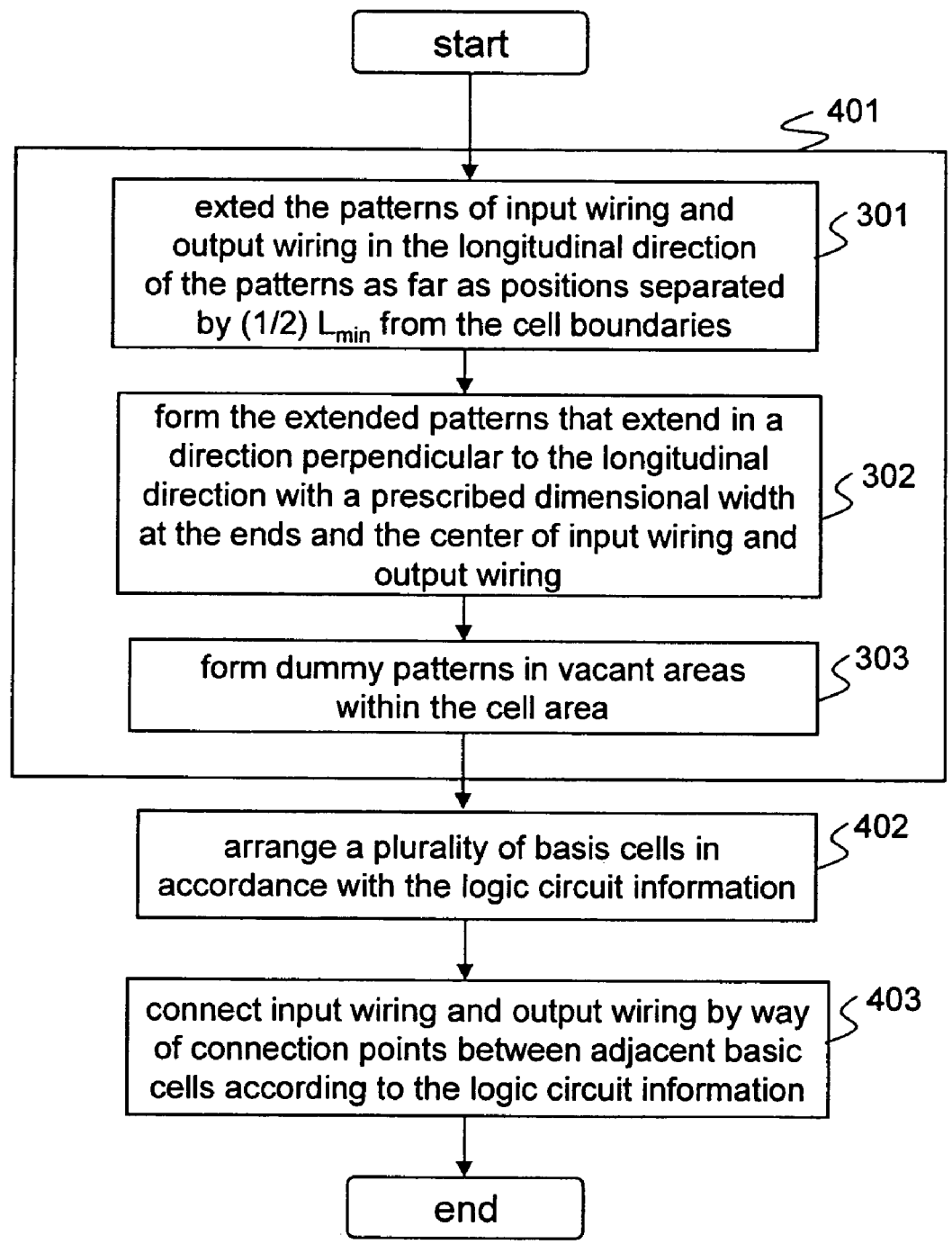
FIG. 7 is a flow chart showing the procedure of the design method of the first working example.

FIG. 7 is a flow chart showing the procedure of the design method of the present working example.

A basic cell is designed in Step 401 as next described. The patterns of input wiring and output wiring are extended in the longitudinal direction of the patterns as far as positions separated by (½) $L_{min}$ from the cell boundaries (Step 301). The longitudinal direction of the patterns is the Y-axis direction of FIG. 5. The dimensional width of these extended patterns is identical to that of the original input wiring and output wiring. The same is true of the rest of the extended patterns. First extended patterns are next formed at the ends of the extended input wiring and output wiring, these extended patterns extending as far as positions separated by (½) $L_{min}$ from cell boundaries in a direction perpendicular (the X-axis direction in FIG. 5) to the longitudinal direction. At this time, the distance between patterns is made greater than the minimum lithographic dimension to maintain isolation between patterns within the basic cell. In addition, second extended patterns of the above-described dimensional width are formed as far as positions separated by (½) $L_{min}$ from the cell boundaries in a direction perpendicular to the longitudinal direction at the centers of the input wiring and output wiring (Step 302). Dummy patterns are next formed in vacant areas within the cell area (Step 303). The basic cell shown in FIG. 5 is thus produced by carrying out the processes from Step 301 to Step 303.

After designing the basic cell in Step 401, the layout is designed as follows. As shown in FIG. 6, a plurality of basic cells is arranged in accordance with the logic circuit information (Step 402). Input wiring and output wiring are further connected by way of connection points between adjacent basic cells according to the logic circuit information (Step 403).

By means of the basic cell design method of the present working example, basic cells include points at which connection is possible between adjacent cells by means of first-layer wiring above and below and to the left and right of the cell area, and, by means of the first extended patterns, the upper and lower connection points are provided with the longest possible areas. As a result, areas in which connection with adjacent cells is possible are broadened. In addition, second extended patterns are provided at the centers of cells, whereby the positions of the second extended patterns with respect to the upward and downward directions do not change even when the cells are rotated 180°. This configuration therefore facilitates connections between the second extended patterns of adjacent cells to the right and left and increases the degree of freedom in layout design.

Dummy patterns further fill in vacant areas within the cell. Such a configuration prevents the provision of wiring that contradicts the designer's intent in vacant areas when the design device carries out automatic wiring operations and therefore relieves the designer of the task of performing corrections when wiring that contradicts the designer's intent is connected.

In the layout design method using the basic cell of the present working example, the first-layer wiring is used for connections with adjacent cells to enable connections with the shortest distance and at low resistance, whereby the problem of the increase in resistance caused by through-hole resistance can be prevented without using the wiring of second and subsequent layers. In addition, inter-cell connections are realized to the greatest possible degree by first-layer wiring, whereby the use of the wiring of second and subsequent layers is limited and more wiring tracks of second and subsequent layers can be secured than in the prior art.

Second Working Example

Explanation next regards the configuration of a basic cell of the present working example with reference to the accompanying figures. As in the first working example, the logic gates are assumed to be inverters.

Figure 8:
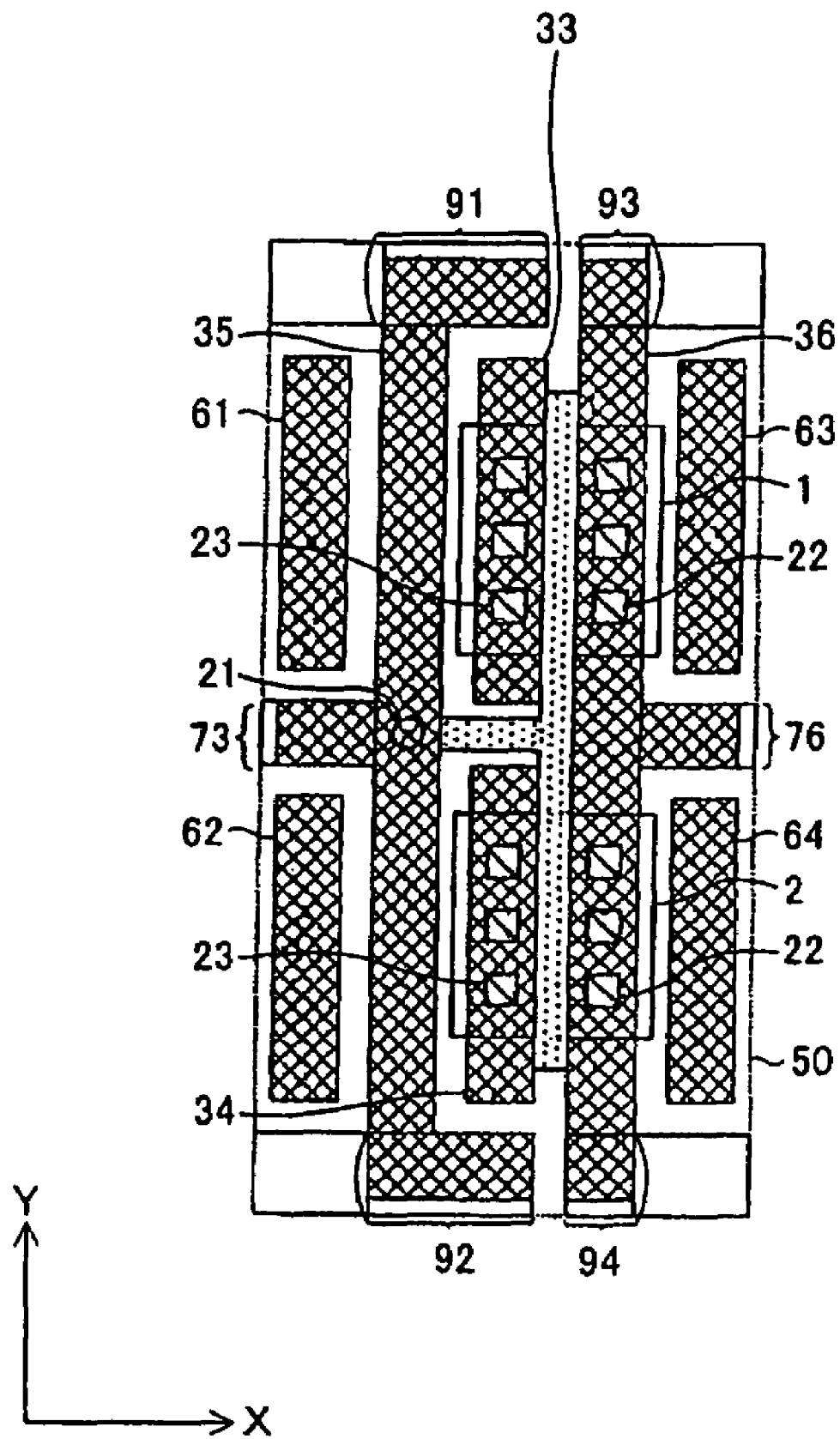
FIG. 8 shows the configuration of a basic cell in the second working example.

FIG. 8 shows the configuration of a basic cell in the present working example. In addition, the same reference numerals are used for configurations that are identical in the first working example, and detailed explanation of these configurations will be omitted. As in FIG. 5, the horizontal direction is the X-axis direction, and the vertical direction is the Y-axis direction in FIG. 8.

In the present working example, first-layer wiring 35 shown in FIG. 8 is input wiring $T_{in}$, and first-layer wiring 36 is output wiring $T_{out}$. As in the first working example, first-layer wiring 35 and first-layer wiring 36 have patterns that extend as far as positions separated by (½) $L_{min}$ from cell boundaries in the Y-axis direction. The difference with the first working example is that the extended patterns of first-layer wiring 35 and 36 are not provided in the corners of cell area 50. As shown in FIG. 8, first-layer wiring 35 has a pattern in which the ends of the pattern after extension are extended in the positive direction of the X-axis but not extended in the negative direction. First-layer wiring 36 has a pattern that is extended in the Y-axis direction but not extended from the ends in the X-axis direction.

In the present working example, extended patterns are not provided in a prescribed range from the corners within cell area 50, and as a result, connection points 91 and 92 of first-layer wiring 35 can connect from both the X-axis direction and Y-axis direction as shown in FIG. 8. Similarly, connection points 93 and 94 of first-layer wiring 36 can also connect from both the X-axis direction and the Y-axis direction.

Explanation next regards a case in which the basic cell of the present working example is used in a layout according to the circuit of FIG. 2.

Figure 9:
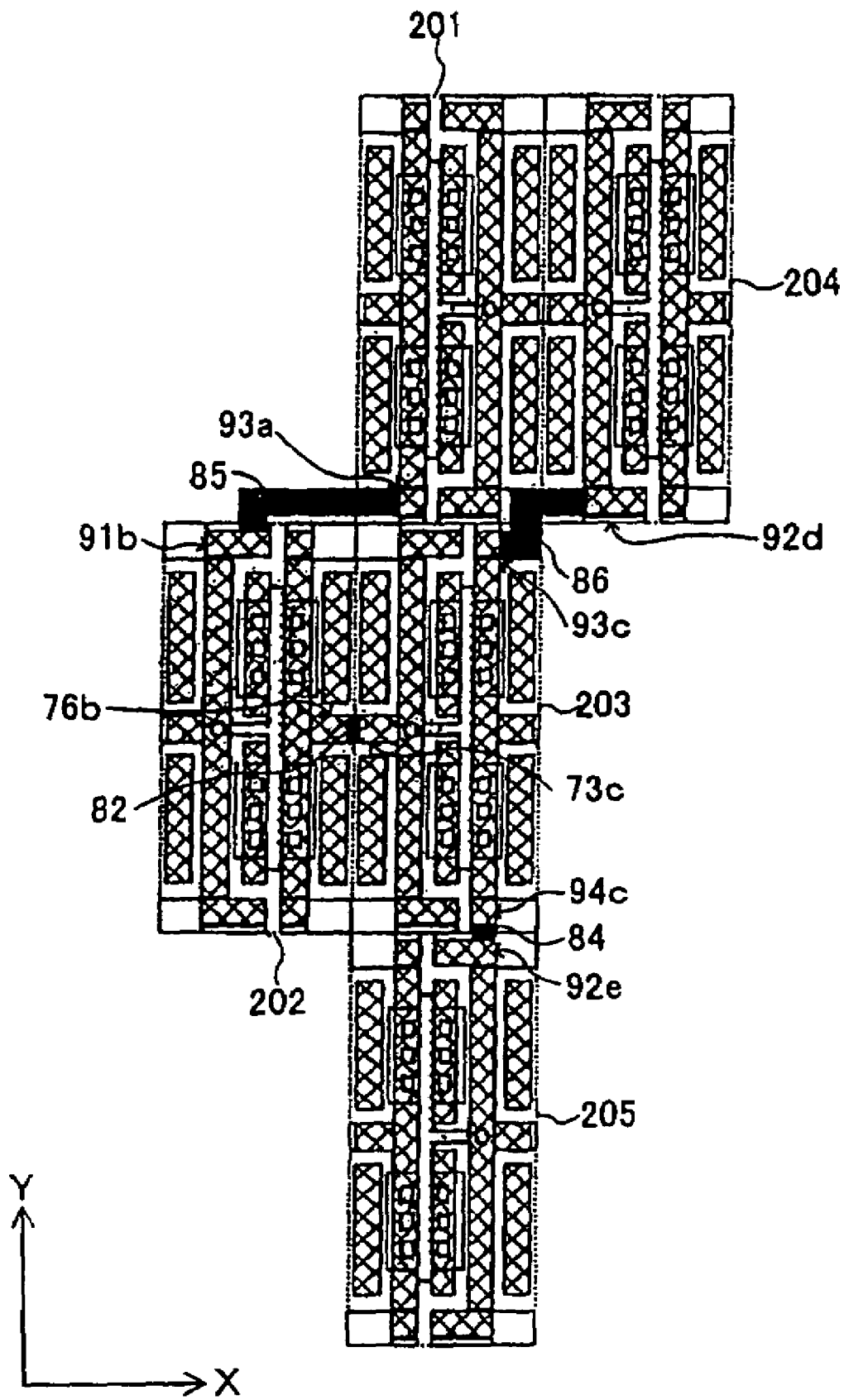
FIG. 9 shows the layout when the basic cell shown in FIG. 8 is used to realize the circuit of FIG. 2.

FIG. 9 shows a layout in which the basic cell shown in FIG. 8 is used to realize the circuit of FIG. 2.

Inverters 141, 142, 143, 144, and 145 of the circuit shown in FIG. 2 correspond to inverters 201, 202, 203, 204, and 205, respectively, shown in FIG. 9. Inverters 201 and 205 shown in FIG. 9 are in a state in which the basic cell shown in FIG. 8 has been rotated 180°.

As shown in FIG. 9, connection point 93a of inverter 201 and connection point 91b of inverter 202 are connected by inter-cell first-layer wiring 85, whereby the output wiring of inverter 201 is connected to the input wiring of inverter 202. As in the first working example, the output wiring of inverter 202 and the input wiring of inverter 203 are connected by inter-cell first-layer wiring 82. Connection point 93c of inverter 203 and connection point 92d of inverter 204 are connected by inter-cell first-layer wiring 86. Connection point 94c of inverter 203 and connection point 92e of inverter 205 are further connected by inter-cell first-layer wiring 84, whereby the output wiring of inverter 203 is connected to the input wiring of each of inverters 204 and 205.

In the case of the first working example, wiring connections were realized between cells that are adjacent horizontally and vertically. In the present working example, the wiring of cells arranged shifted the distance of one cell in the X-axis direction such as inverter 203 and inverter 204 as shown in FIG. 9 can be connected together by inter-cell first-layer wiring 86. This configuration can be realized because first-layer wiring has not been extended into the corners within the cell area as shown in FIG. 8 and the corners are thus secured as areas for inter-cell connection.

Explanation next regards the design method of the basic cell shown in FIG. 8 and the layout shown in FIG. 9 by the design device shown in FIG. 4.

Figure 10:
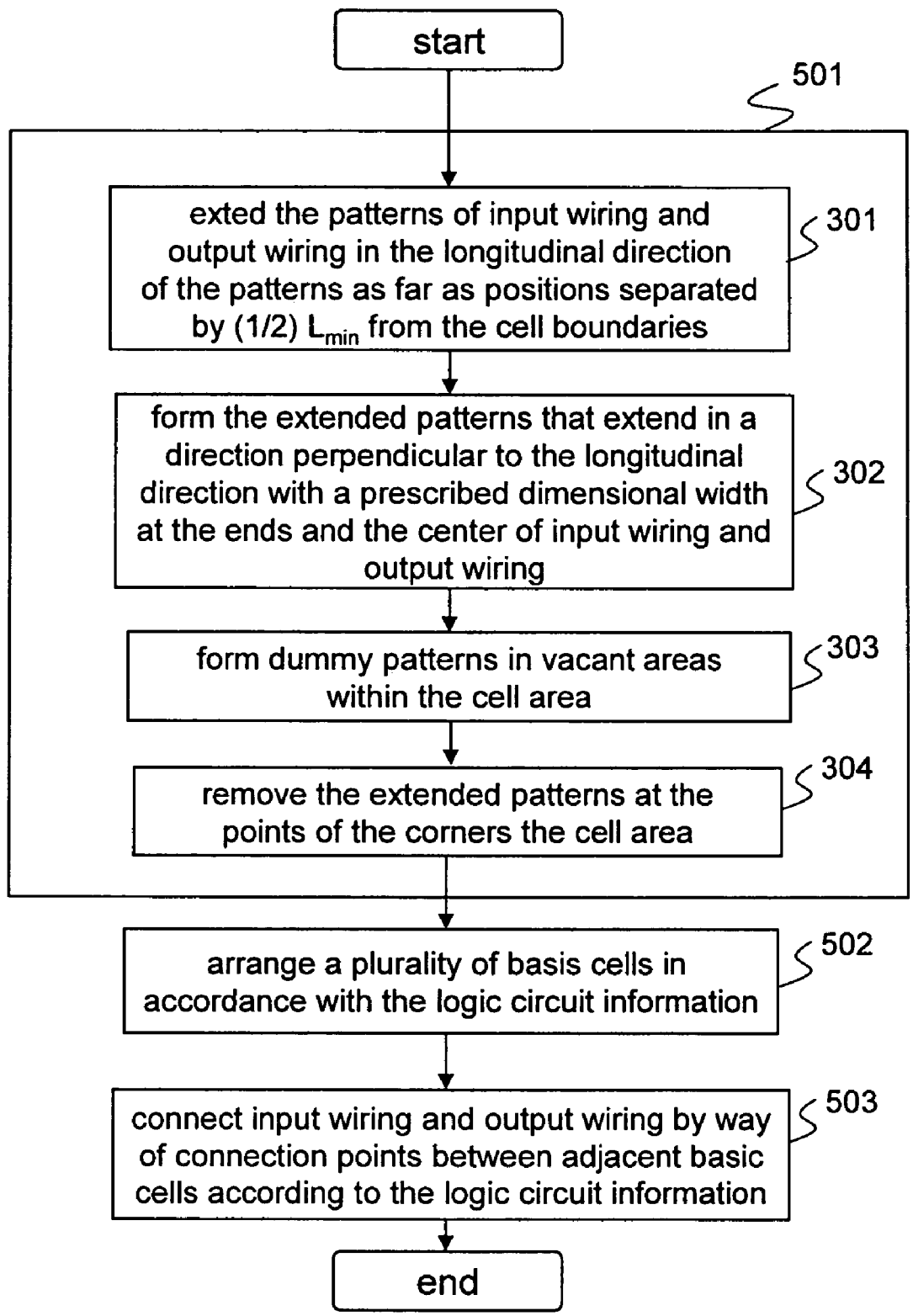
FIG. 10 is a flow chart showing the procedure of the design method of the second working example.

FIG. 10 is a flow chart showing the procedure of the design method of the present working example.

The basic cell is designed in Step 501 as described below. The procedure from Step 301 to Step 303 is carried out similar to Step 401 of the procedure shown in FIG. 7. Of the first extended patterns, the points of the corners of the cell area are subsequently removed (Step 304). The basic cell shown in FIG. 8 is thus produced by carrying out the processes from Step 301 to Step 304.

After designing the basic cell in Step 501, the layout is designed as next described. As shown in FIG. 9, a plurality of basic cells is arranged in accordance with the logic circuit information (Step 502). The input wiring and output wiring are further connected by way of connection points between basic cells in accordance with the logic circuit information (Step 503).

Due to the elimination of the extended patterns in the corners within cells in the basic cell design method of the present working example, the direction of connection of the inter-cell first-layer wiring to the ends of the input wiring and output wiring is not limited to the longitudinal direction (the Y-axis direction in FIG. 8) of these patterns but can also be a direction perpendicular (the X-axis direction in FIG. 8) to the longitudinal direction. As a result, the layout design method of the present working example enables an increase in the freedom of design of inter-cell connections and allows a plurality of basic cells to be arranged diagonally.

Third Working Example

Explanation next regards the configuration of a basic cell of the present working example with reference to the accompanying figures. As in the first working example, logic gates are assumed to be inverters.

Figure 11:
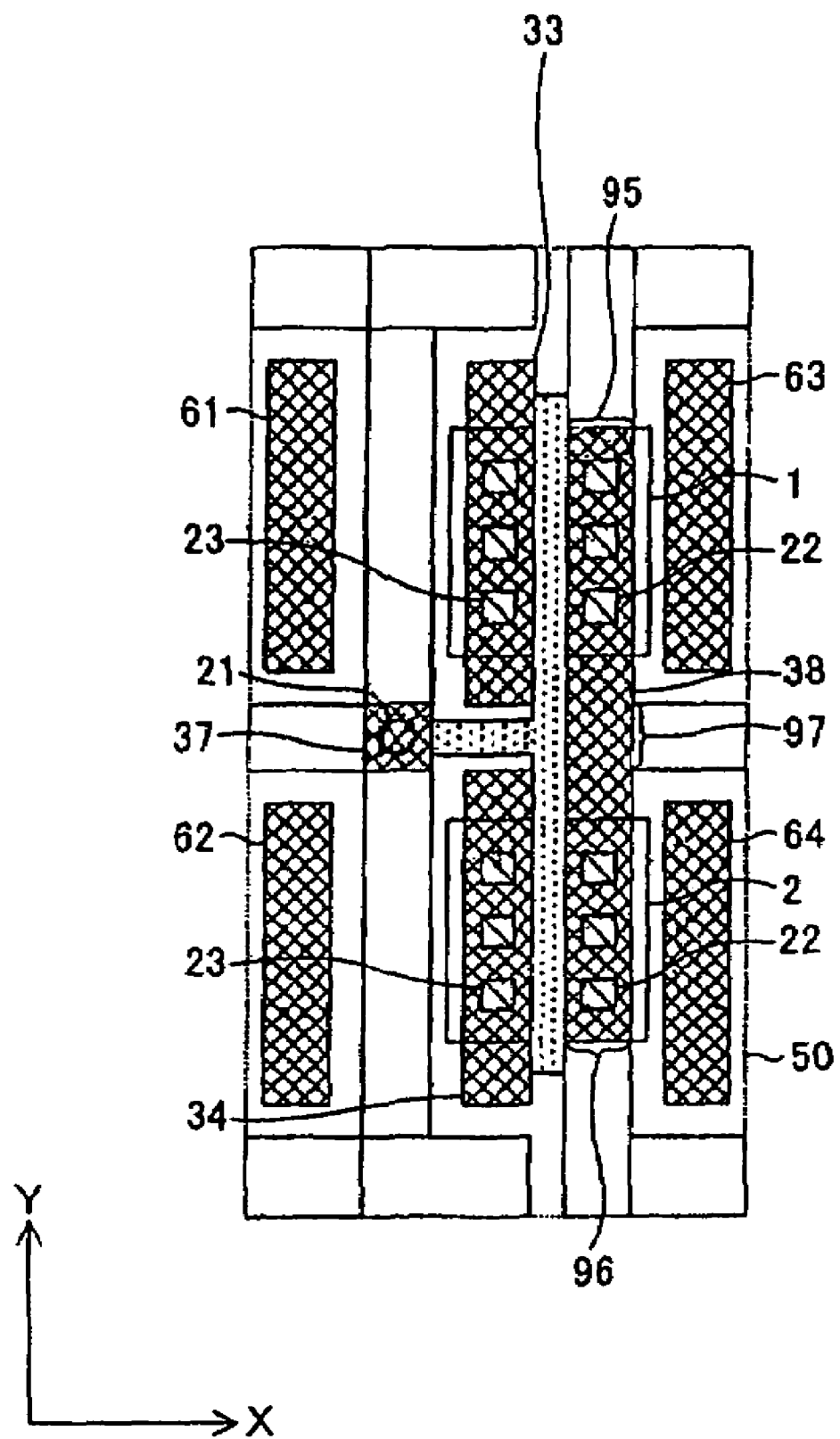
FIG. 11 shows the configuration of a basic cell in the third working example.

FIG. 11 shows the configuration of a basic cell in the present working example. The same reference numerals are conferred to configurations identical to those of the first working example, and detailed explanation of these configurations is omitted. As in FIG. 5, the horizontal direction is the X-axis direction, and the vertical direction is the Y-axis direction in FIG. 11.

In the present working example, first-layer wiring 37 shown in FIG. 11 is input wiring $T_{in}$, and first-layer wiring 38 is output wiring $T_{out}$. The difference between the present working example and the first and second working examples is the greatest possible reduction in the size of the patterns of input wiring $T_{in}$ and output wiring $T_{out}$. First-layer wiring 37 is of a size that allows a patterning margin to prevent exposure of contact hole 21 due to dimensional discrepancies in the lithography step when patterning first-layer wiring 37. For the same reason, first-layer wiring 38 is of a size that allows a patterning margin such that contact holes 22 opened in the drain electrodes of PMOS transistor 1 and NMOS transistor 2 are not exposed when patterning first-layer wiring 38. In the pattern of first-layer wiring 38, the end in the positive direction of the Y-axis is referred to as connection point 95, the end in the negative direction of the Y-axis is referred to as connection point 96, and the center of the pattern is referred to as connection point 97.

Surplus areas are not provided in the patterns of input wiring and output wiring in the present working example, and the parasitic capacitance due to wiring is therefore reduced. This point will be explained by taking an example in which the basic cell of the present working example is applied to a circuit.

Figure 12:
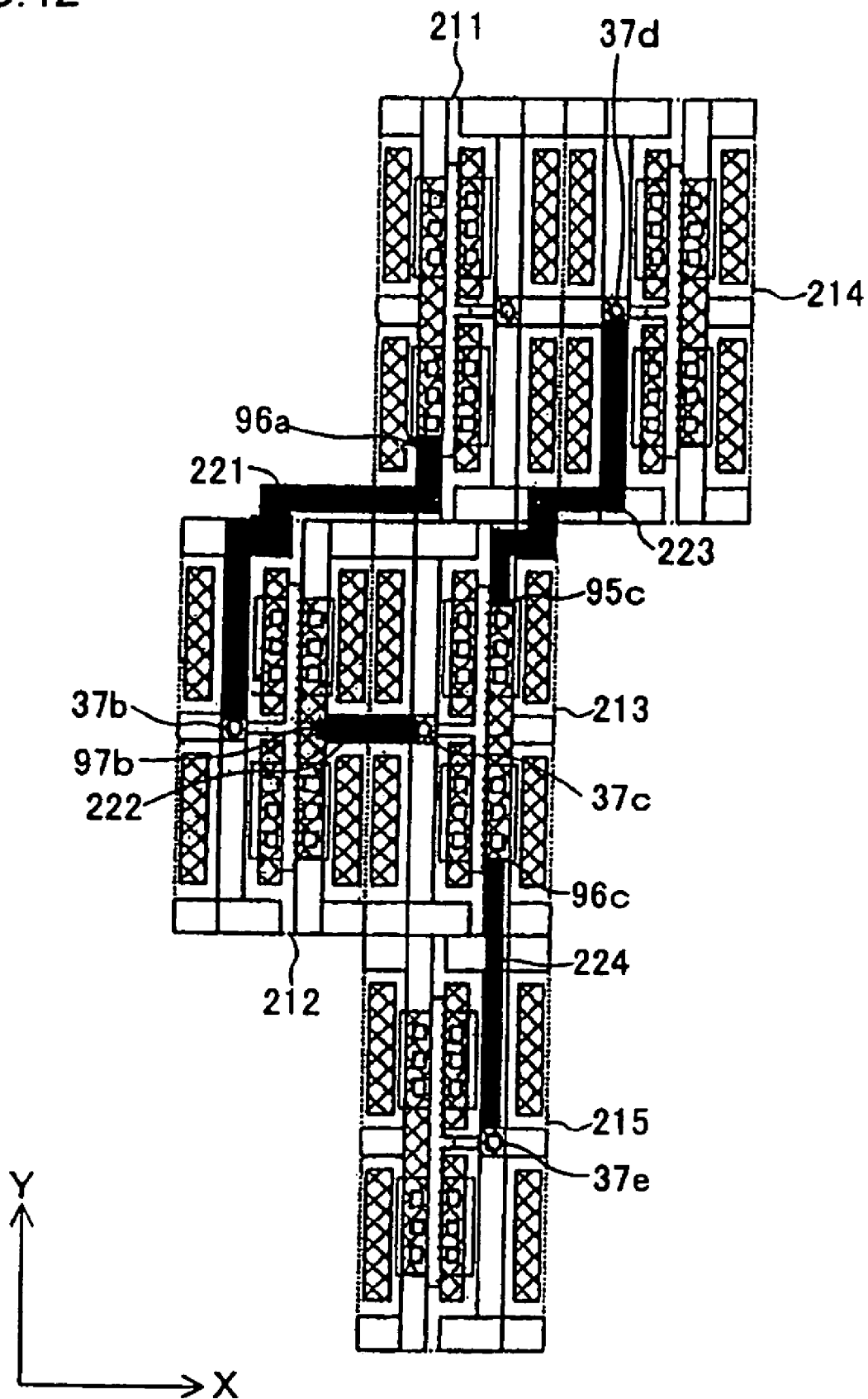
FIG. 12 shows the layout when the basic cell shown in FIG. 11 is used to realize the circuit of FIG. 2.

FIG. 12 shows the layout for a case in which the basic cell shown in FIG. 11 is applied to the circuit of FIG. 2.

Inverters 141, 142, 143, 144, and 145 of the circuit shown in FIG. 2 correspond to inverters 211, 212, 213, 214, and 215, respectively, of the layout shown in FIG. 12. Inverters 211 and 215 shown in FIG. 12 are in a state in which the basic cell shown in FIG. 11 has been rotated 180°.

As shown in FIG. 12, connection point 96a of inverter 211 and first-layer wiring 37b of inverter 212 are connected by inter-cell first-layer wiring 221, whereby the output wiring of inverter 211 is connected to the input wiring of inverter 212. Connection point 97b of inverter 212 is connected to first-layer wiring 37c of inverter 213 by inter-cell first-layer wiring 222, whereby the output wiring of inverter 212 is connected to the input wiring of inverter 213 by inter-cell first-layer wiring 222.

Connection point 95c of inverter 213 is further connected to first-layer wiring 37d of inverter 214 by inter-cell first-layer wiring 223, and connection point 96c of inverter 213 is further connected to first-layer wiring 37e of inverter 215 by inter-cell first-layer wiring 224, whereby the output wiring of inverter 213 is connected to the input wiring of each of inverters 214 and 215.

Similar to the second working example, the present working example allows the connection of the wiring of cells that are arranged shifted one cell in the X-axis direction. Further, as in the first working example, areas for extending the input wiring and output wiring in the Y-axis direction, areas for the first extended pattern, and areas for the second extended pattern are secured as shown in FIG. 12. Necessary wiring locations in the secured areas are then formed by inter-cell first-layer wiring in place of the first extended pattern or second extended pattern. As a result, excessive parasitic capacitance will not occur in areas in which inter-cell first-layer wiring is not provided.

Explanation next regards the design method of the basic cell shown in FIG. 11 and the layout shown in FIG. 12 by means of the design device shown in FIG. 4.

Figure 13:
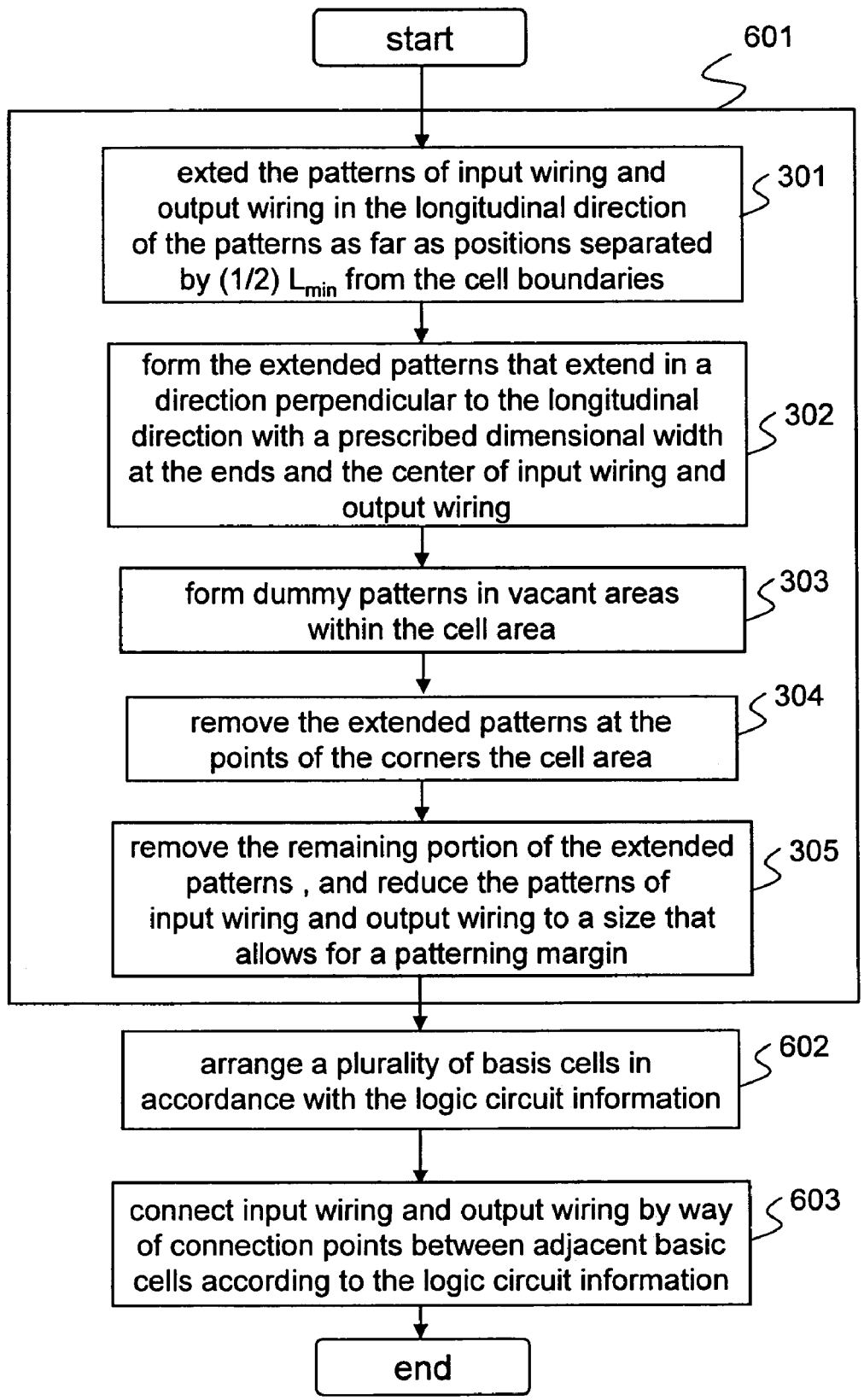
FIG. 13 is a flow chart showing the procedure of the design method of the third working example.

FIG. 13 is a flow chart showing the procedure of the design method of the present working example.

The basic cell is designed in Step 601 as next described. The procedure from Step 301 to Step 304 is carried out similar to Step 501 of the procedure shown in FIG. 10. The remaining portion of the first extended patterns and the second extended patterns are then removed, and further, the patterns of input wiring $T_{in}$ and output wiring $T_{out}$ are reduced to a size that allows for a patterning margin (Step 305). In this way, the basic cell shown in FIG. 11 is produced by carrying out the processes from Step 301 to Step 305.

After designing the basic cell in Step 601, the layout is designed as next described. As shown in FIG. 12, a plurality of basic cells is arranged in accordance with the logic circuit information (Step 602). Input wiring and output wiring are further connected between basic cells in accordance with the logic circuit information (Step 603).

In the basic cell design method of the present working example, once the extended patterns of input wiring and output wiring have been formed as in the first working example, dummy patterns are formed in vacant areas within cells, following which the patterns of input wiring and output wiring are reduced. The present working example thus both obtains the effect of the first working example of securing areas for inter-cell connections while preventing the occupation, by dummy patterns, of areas for providing the inter-cell first-layer wiring, and further enables a reduction of the parasitic capacitance of areas in which inter-cell first-layer wiring is not provided.

In the first to third working examples, explanation has regarded examples in which logic gates are realized by inverters, but the logic gates may take other forms such as AND gates and OR gates.

In addition, a program for causing a computer to execute the basic cell design method of the present invention may be recorded on a recording medium that can be read by a computer.

While preferred embodiments of the present invention have been described using specific terms, such description is for illustrative purposes only, and it is to be understood that changes and variations may be made without departing from the spirit or scope of the following claims.

What is claimed is:

1. A basic cell design method of logic gates having input wiring and output wiring within a cell, comprising:
    carrying out extended pattern formation on a computer, comprising:
        extending patterns of said input wiring and said output wiring in a longitudinal direction of the patterns;
        forming first extended patterns that extend in a direction perpendicular to the longitudinal direction with a prescribed dimensional width at ends of the extended patterns; and
        forming second extended patterns that extend with said prescribed dimensional width from the input wiring and the output wiring at a center of said cell in said longitudinal direction: and
    after carrying out said extended pattern formation, carrying out dummy pattern formation, for arranging dummy patterns in vacant areas within the cell.

2. A basic cell design method according to claim 1, wherein, after carrying out said dummy pattern formation, portions of said first extended patterns within a prescribed range from corners of said cell are removed.

3. A layout design method of a logic circuit that uses basic cells according to the basic cell design method according to claim 2, wherein:
    a plurality of said basic cells are arranged in accordance with logic circuit information that includes a number of said logic gates and connection relations of said logic gates; and
    the patterns of said input wiring and said output wiring between said plurality of basic cells are connected in the same layer as patterns in accordance with said logic circuit information.

4. A basic cell design method according to claim 1, wherein, after carrying out said dummy pattern formation, said first extended patterns and said second extended patterns are removed, and further, the patterns of said input wiring and said output wiring are reduced.

5. A layout design method of a logic circuit that uses basic cells according to the basic cell design method according to claim 4, wherein:
    a plurality of said basic cells are arranged in accordance with logic circuit information that includes a number of said logic gates and connection relations of said logic gates; and
    the patterns of said input wiring and said output wiring between said plurality of basic cells are connected in the same layer as patterns in accordance with said logic circuit information.

6. A layout design method of a logic circuit that uses basic cells according to the basic cell design method according to claim 1, wherein:
    a plurality of said basic cells are arranged in accordance with logic circuit information that includes a number of said logic gates and connection relations of said logic gates; and
    the patterns of said input wiring and said output wiring between said plurality of basic cells are connected in the same layer as patterns in accordance with said logic circuit information.

7. The basic cell design method according to claim 1, wherein each of the dummy patterns is formed between the first and second extended patterns.

8. The basic cell design method according to claim 1, wherein the extended pattern formation comprises:
    extending the patterns of the input wiring and the output wiring in the longitudinal direction as far as positions separated by one-half of a minimum lithographic dimension from cell boundaries; and
    extending the first extended patterns and the second extended patterns as far as positions separated by one-half of the minimum lithographic dimension from cell boundaries.

9. A basic cell design method of logic gates having input wiring and output wiring within a cell, comprising:
    carrying out extended pattern formation on a computer, comprising:
        extending patterns of said input wiring and said output wiring in a longitudinal direction of the patterns;

forming first extended patterns that extend in a direction perpendicular to the longitudinal direction with a prescribed dimensional width at ends of the extended patterns; and forming second extended patterns that extend with said prescribed dimensional width from the input wiring and the output wiring at a center of said cell in said longitudinal direction: and after carrying out said extended pattern formation, carrying out dummy pattern formation, for arranging dummy patterns in vacant areas within the cell, wherein said extended pattern formation includes processes of extending the patterns of said input wiring and said output wiring in said longitudinal direction as far as positions separated by one-half of a minimum lithographic dimension from cell boundaries and extending said first extended patterns and said second extended patterns as far as positions separated by one-half of said minimum lithographic dimension from cell boundaries, and wherein said dummy pattern formation includes a process of arranging said dummy patterns such that a distance of at least said minimum lithographic dimension is maintained with other patterns within said cell and a distance of one-half said minimum lithographic dimension is maintained from cell boundaries.

10. A basic cell design method according to claim 9, wherein, after carrying out said dummy pattern formation, portions of said first extended patterns within a prescribed range from corners of said cell are removed.

11. A layout design method of a logic circuit that uses basic cells according to the basic cell design method according to claim 10, wherein:
a plurality of said basic cells are arranged in accordance with logic circuit information that includes a number of said logic gates and connection relations of said logic gates; and
the patterns of said input wiring and said output wiring between said plurality of basic cells are connected in the same layer as patterns in accordance with said logic circuit information.

12. A basic cell design method according to claim 9, wherein, after carrying out said dummy pattern formation, said first extended patterns and said second extended patterns are removed, and further, the patterns of said input wiring and said output wiring are reduced.

13. A layout design method of a logic circuit that uses basic cells according to the basic cell design method according to claim 12, wherein:
a plurality of said basic cells are arranged in accordance with logic circuit information that includes a number of said logic gates and connection relations of said logic gates; and
the patterns of said input wiring and said output wiring between said plurality of basic cells are connected in the same layer as patterns in accordance with said logic circuit information.

14. A layout design method of a logic circuit that uses basic cells according to the basic cell design method according to claim 9, wherein:
a plurality of said basic cells are arranged in accordance with logic circuit information that includes a number of said logic gates and connection relations of said logic gates; and
the patterns of said input wiring and said output wiring between said plurality of basic cells are connected in the same layer as patterns in accordance with said logic circuit information.

15. A design device comprising:
a memory unit for storing configuration information of logic gates having input wiring and output wiring within a cell; and
a control unit for, upon an input of configuration of said logic gates and instructions indicating that a basic cell of said logic gates is to be designed, extending patterns of said input wiring and said output wiring in a longitudinal direction of said patterns, forming first extended patterns that extend in a direction perpendicular to the longitudinal direction with a prescribed dimensional width at ends of said extended patterns, forming second extended patterns that extend with said prescribed dimensional width from the input wiring and the output wiring at a center of said cell in the longitudinal direction, and arranging dummy patterns in vacant areas within said cell.

16. The design device according to claim 15, wherein the control unit extends the patterns of the input wiring and the output wiring in the longitudinal direction as far as positions separated by one-half of a minimum lithographic dimension from cell boundaries, and extends the first extended patterns and the second extended patterns as far as positions separated by one-half of the minimum lithographic dimension from cell boundaries.

17. The design device according to claim 16, wherein the control unit arranges the dummy patterns such that a distance of at least the minimum lithographic dimension is maintained with other patterns within the cell and a distance of one-half the minimum lithographic dimension is maintained from cell boundaries.

18. A computer-readable storage medium tangibly embodying a computer program for causing a computer to execute a design method of a basic cell that uses logic gates having input wiring and output wiring within a cell, said program causing the computer to execute processes for:
carrying out extended pattern formation for:
extending patterns of said input wiring and said output wiring in a longitudinal direction of the patterns,
forming first extended patterns that extend with a prescribed dimensional width in a direction perpendicular to the longitudinal direction at ends of the extended patterns; and
forming second extended patterns that extend with said prescribed dimensional width from the input wiring and the output wiring at a center of said cell in said longitudinal direction; and
after carrying out said extended pattern formation, carrying out dummy pattern formation for arranging dummy patterns in vacant areas within said cell.

19. The computer-readable storage medium tangibly embodying a computer program according to claim 18, wherein the extended pattern formation comprises:
extending the patterns of the input wiring and the output wiring in the longitudinal direction as far as positions separated by one-half of a minimum lithographic dimension from cell boundaries; and
extending the first extended patterns and the second extended patterns as far as positions separated by one-half of the minimum lithographic dimension from cell boundaries.

20. The computer-readable storage medium tangibly embodying a computer program according to claim 19, wherein the dummy pattern formation comprises:

arranging the dummy patterns such that a distance of at least the minimum lithographic dimension is maintained with other patterns within the cell and a distance of one-half the minimum lithographic dimension is maintained from cell boundaries.

* * * * *